(12) United States Patent
Kim

(10) Patent No.: US 7,956,527 B2
(45) Date of Patent: Jun. 7, 2011

(54) ORGANIC ELECTROLUMINESCENCE DISPLAY PANEL AND METHOD FOR FABRICATING THE SAME

(75) Inventor: Chang Nam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 233 days.

(21) Appl. No.: 10/824,363

(22) Filed: Apr. 15, 2004

(65) Prior Publication Data

US 2004/0207317 A1    Oct. 21, 2004

(30) Foreign Application Priority Data

Apr. 16, 2003    (KR) .................. 10-2003-0024112

(51) Int. Cl.
*H01L 51/00* (2006.01)
*H05B 33/06* (2006.01)
(52) U.S. Cl. .................. 313/504; 313/505; 313/512
(58) Field of Classification Search .................. 313/504, 313/506, 509, 512, 505
See application file for complete search history.

(56) References Cited

U.S. PATENT DOCUMENTS

| 6,111,357 A | 8/2000 | Fleming et al. |
| 6,611,095 B2 * | 8/2003 | Kim .............................. 313/505 |
| 6,614,177 B2 * | 9/2003 | Kanno et al. .................. 313/506 |
| 2002/0014837 A1 * | 2/2002 | Kim et al. ..................... 313/505 |

FOREIGN PATENT DOCUMENTS

| JP | 59-166224 U | 11/1984 |
| JP | 2000-021567 | 1/2000 |
| JP | 2000-36381 A | 2/2000 |
| JP | 2001-176657 A | 6/2001 |
| JP | 2002-8871 A | 1/2002 |

OTHER PUBLICATIONS

Office Action issued Nov. 24, 2009 in corresponding Japanese Application No. 2004-120194.

* cited by examiner

*Primary Examiner* — Karabi Guharay
(74) *Attorney, Agent, or Firm* — Morgan, Lewis & Bockius LLP

(57) ABSTRACT

An organic electroluminescence display panel and a method for fabricating the same are disclosed, wherein a line resistance is reduced and an adhesion between a glass substrate and a seal-cover is enhanced. The method includes forming an indium-tin-oxide strip being a transparent electrode, so as to apply an anode onto a glass substrate, forming a counter electrode in a grid form, so as to have a width smaller than that of the indium-tin-oxide strip, forming a first insulating layer and a barrier rib, serially forming an electroluminous layer and a cathode strip, and adhering a seal-cover to the glass substrate by using a sealant.

13 Claims, 12 Drawing Sheets

UV Light

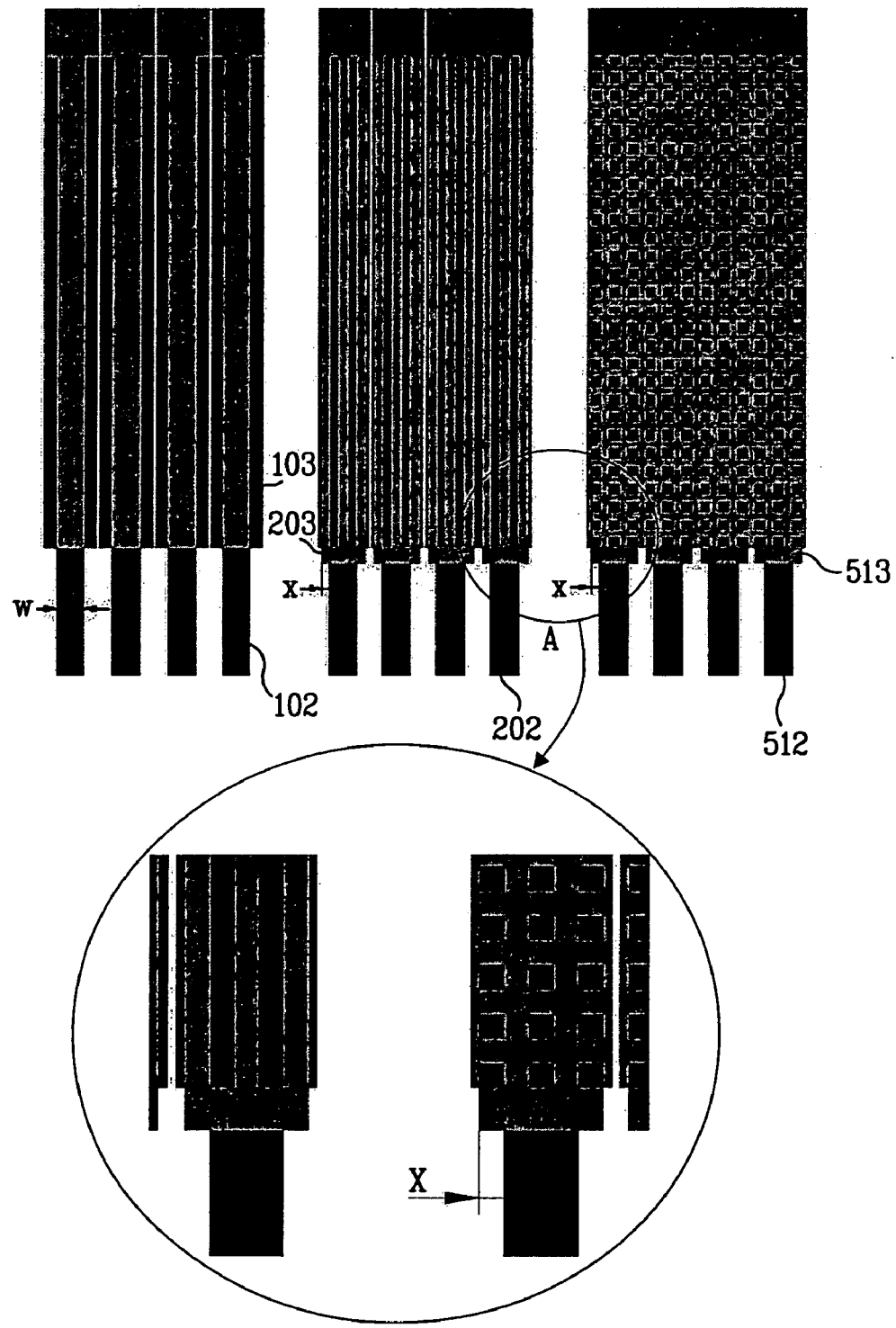

ORGANIC ELECTROLUMINESCENCE DISPLAY PANEL AND METHOD FOR FABRICATING THE SAME

CROSS-REFERENCE TO RELATED APPLICATIONS

This application claims the benefit of Korean Application No. P2003-024112, filed on Apr. 16, 2003, which is hereby incorporated by reference as if fully set forth herein.

BACKGROUND OF THE INVENTION

1. Field of the Invention

The present invention relates to a display panel, and more particularly, to an organic electroluminescence display panel and a method for fabricating the same. Although the present invention is suitable for a wide scope of applications, it is particularly suitable for decreasing line resistance and improving adhesion between a glass substrate and a seal-cover, thereby enhancing efficiency and durability of the organic electroluminescence display panel.

2. Discussion of the Related Art

Recently, a wide range of self-emissive luminescent display devices has been developed. However, the basic structure of such devices includes using a luminescence device that operates a single pixel as the main element, whereby the luminescence device is in planar alignment. Plasma display panels (PDP) using cells divided by discharge areas as a luminescence device, vacuum fluorescence displays (VFD), electroluminescence displays (ELD), light-emitting diodes (LED), and field emission displays (FED) can be given as examples of the above-described display devices.

Among such display devices, the organic electroluminescence (EL) display panel using an organic electroluminescence device as its main element, which provides a high-luminance surface emission at a low voltage and also an RGB light emission having a high color purity depending upon the selected material. Accordingly, the organic electroluminescence display panel is viewed as one of the most prominent display devices having the characteristics of slim design, lightweight, and full color representation.

The organic electroluminescence device is formed of an organic layer including an emission layer between a pair of electrodes formed of an anode having a positive voltage applied thereto and a cathode having a negative voltage applied thereto. By applying a voltage between the electrodes, an electron is injected into the organic layer from the cathode, and a hole is injected into the organic layer from the anode. Subsequently, the electron and the hole are paired to each other within the organic layer, thereby emitting light.

The organic electroluminescence display panel formed of the organic electroluminescence device having the above-described structure will now be described with reference to the accompanying drawings.

FIG. 1 illustrates a plane view of a general organic electroluminescence display panel.

Referring to FIG. 1, an indium-tin-oxide (ITO) strip 102 is linearly aligned in a strip form on a glass substrate 101. Subsequently, a counter electrode 103 having a width narrower than the ITO strip 102 is formed on the ITO strip 102. And, an organic electroluminous (EL) layer 104 formed of a hole transport layer, an emission layer, and an electron transport layer serially deposited thereon, is formed over the ITO strip 102. An insulating layer 106 is formed between the ITO strip 102 and a barrier rib. A cathode strip 105 formed in the shape of a strip overlaps the ITO strip 102 above the organic EL layer 104. Then, a barrier rib 107 formed in the shape of a strip is formed between each cathode strip 105, so as to separate the cathode strips 105 adjacent to one another. Finally, the organic EL display panel is completed when the substrate having the cathode strips 105 formed thereon is paired with a seal-cover 109 by using a sealant 108.

Herein, the organic EL display panel is formed of the organic EL layer 104 inserted between the ITO strip 102 having a high work function and the cathode strip 105 having a low function on the glass substrate 101. The ITO strip 102 having a high work function is used as an anode for injecting a hole, and the cathode strip 105 having a low work function is used as a cathode for injecting an electron.

FIGS. 2A to 2F illustrate perspective views of the process steps for fabricating the general organic electroluminescence display panel.

Referring to FIG. 2A, the ITO strip 102 (i.e., a transparent electrode) for applying an anode is formed on the glass substrate 101. Simultaneously, an ITO strip 102-A having a shorter length is formed between the barrier rib 107, so as to facilitate the removal of the cathode strip 105 in a later process.

Subsequently, as shown in FIG. 2B, the counter electrode 103 is formed of a highly conductive metal, such as molybdenum (Mo) and chrome (Cr). Herein, at a vertical crossing point between the sealant 108 used in the sealing process and the counter electrode 103, when the width of the counter electrode 103 is larger than the width of the ITO strip 102, the sealant 108 formed on the counter electrode 103 cannot be hardened during a hardening process of the sealant 108 by using UV light rays in a later process step. Therefore, at the crossing point between the sealant 108 and the counter electrode 103, the width of the counter electrode 103 is formed to be smaller than that of the ITO strip 102 formed thereunder.

Thereafter, referring to FIGS. 2C and 2D, in order to insulate the cathode strip 105 from the ITO strip 102, the insulating layer 106 and the barrier rib 107 are formed on the ITO strip 102. Herein, the insulating layer 106 is formed of an organic compound, an inorganic compound, a polymer, and a blended form of the same.

Furthermore, as shown in FIGS. 2E and 2F, the organic EL layer 104 is deposited over the insulating layer 106 and the barrier rib 107, so as to form the cathode strip 105, which is formed of a magnesium (Mg)-silver (Ag) alloy and aluminum (Al) or other conductive materials.

In the organic EL display panel having the above-described structure, the role of the sealing process is very important to the durability and efficiency of the display panel, which will now be described in detailed with reference to FIGS. 3A and 3B.

FIG. 3A illustrates a cross-sectional view of the panel taken along an X direction of FIG. 2F. And, FIG. 3B illustrates a cross-sectional view of the panel taken along a Y direction of FIG. 2F.

The organic EL display panel completed by the fabrication process shown in FIGS. 2A to 2F have the following problems. More specifically, referring to FIGS. 3A and 3B, when hardening the sealant 108 with UV light rays in a later process, if the width of the counter electrode 103 is larger than that of the ITO strip 102 at the point where the sealant 108 and the counter electrode 103 vertically cross each other, then the UV light rays cannot be transmitted through the counter electrode 103, which is formed of a metal. Therefore, an unhardened sealant 108-A remains on the counter electrode 103, as shown in FIG. 3B.

As described above, if the sealant 108 at the crossing point between the sealant 108 and the counter electrode 103 is not hardened, then the glass substrate 101 and the seal-cover 109 cannot be adhered to each other, which results in a penetration of moisture and oxygen, thereby causing a critical influence on the durability of the organic EL display panel.

Meanwhile, in order to resolve such problems and to facilitate the hardening of the sealant 108, a portion of the counter electrode 103 formed on the area where the sealant 108 is sprayed can either be removed or be dividedly formed in thin layers, as shown in FIG. 4.

However, when the portion of the counter electrode 103 formed on the area where the sealant 108 is sprayed is either removed or dividedly formed in thin layers, a line resistance is increased, thereby causing the problem of an increase in the driving voltage. Since the organic EL display panel is driven by electric current, the driving voltage increases as the line resistance rises.

Furthermore, since a plurality of cathode strips 105 is connected to a single ITO strip 102, a large amount of electric current is flown therein, thereby causing the efficiency of the organic EL display panel to be highly sensitive to the resistance.

SUMMARY OF THE INVENTION

Accordingly, the present invention is directed to an organic electroluminescence display panel and a method for fabricating the same that substantially obviate one or more problems due to limitations and disadvantages of the related art.

An object of the present invention is to provide an organic electroluminescence display panel and a method for fabricating the same that improves the adhesion between a glass substrate and a seal-cover.

Another object of the present invention is to provide an organic electroluminescence display panel and a method for fabricating the same that reduces a line resistance caused by a counter electrode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescence display panel formed of a glass substrate including an indium-tin-oxide strip, a counter electrode, an organic electroluminous layer, and a cathode strip, adhered to a seal-cover by using a sealant, wherein the counter electrode is formed in a grid form at a crossing point between the counter electrode and the sealant.

Herein, the counter electrode is formed in one of or a combination of at least two of a polygon, a cross, and a circle.

In another aspect of the present invention, a method for fabricating an organic electroluminescence display panel includes forming an indium-tin-oxide strip being a transparent electrode, so as to apply an anode onto a glass substrate, forming a counter electrode in a grid form, so as to have a width smaller than that of the indium-tin-oxide strip, forming a first insulating layer and a barrier rib, serially forming an electroluminous layer and a cathode strip, and adhering a seal-cover to the glass substrate by using a sealant.

Herein, the forming a counter electrode in a grid form includes forming the counter electrode in one of or a combination of at least two of a polygon, a cross, and a circle.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings;

FIG. 7A illustrates the structure of a counter electrode of a general organic electroluminescence display panel;

FIG. 7B illustrates the structure of a counter electrode of a related art organic electroluminescence display panel; and FIG. 7C illustrates a comparison between the structure of the counter electrode of FIGS. 7A and 7B and the structure of the counter electrode according to the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 5A to 5F illustrate perspective views of the process steps for fabricating an organic electroluminescence display panel according to the present invention.

Figure 5A:
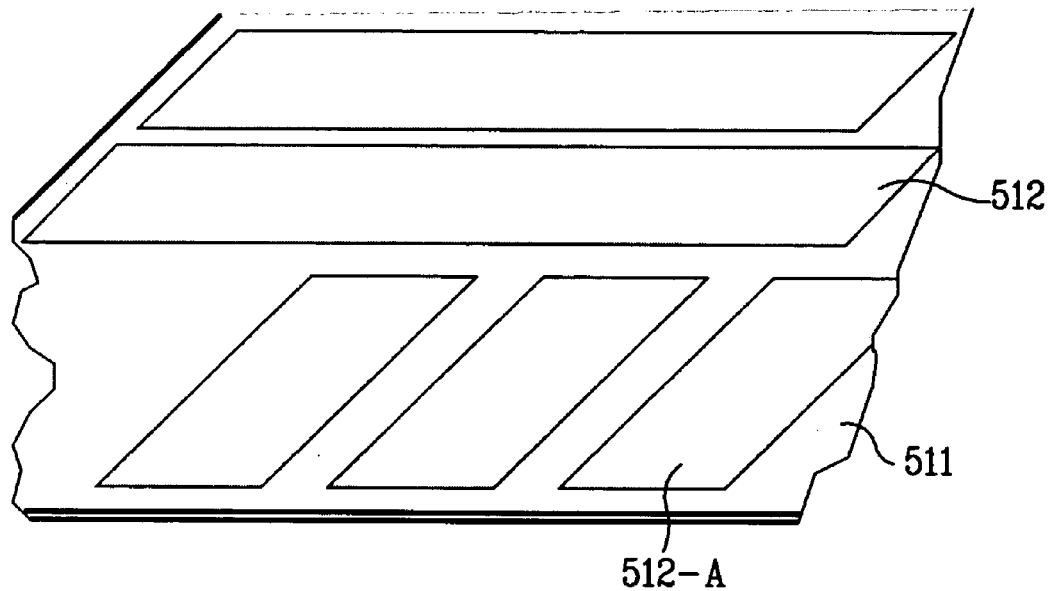
FIGS. 5A to 5F illustrate perspective views of the process steps for fabricating an organic electroluminescence display panel according to the present invention.

Referring to FIG. 5A, the ITO strip 512 for applying an anode is formed on the glass substrate 511. Simultaneously, an ITO strip 512-A having a shorter length is formed between the barrier rib formed in a later process, so as to facilitate the removal of the cathode strip 105, also formed in a later process.

Figure 5B:
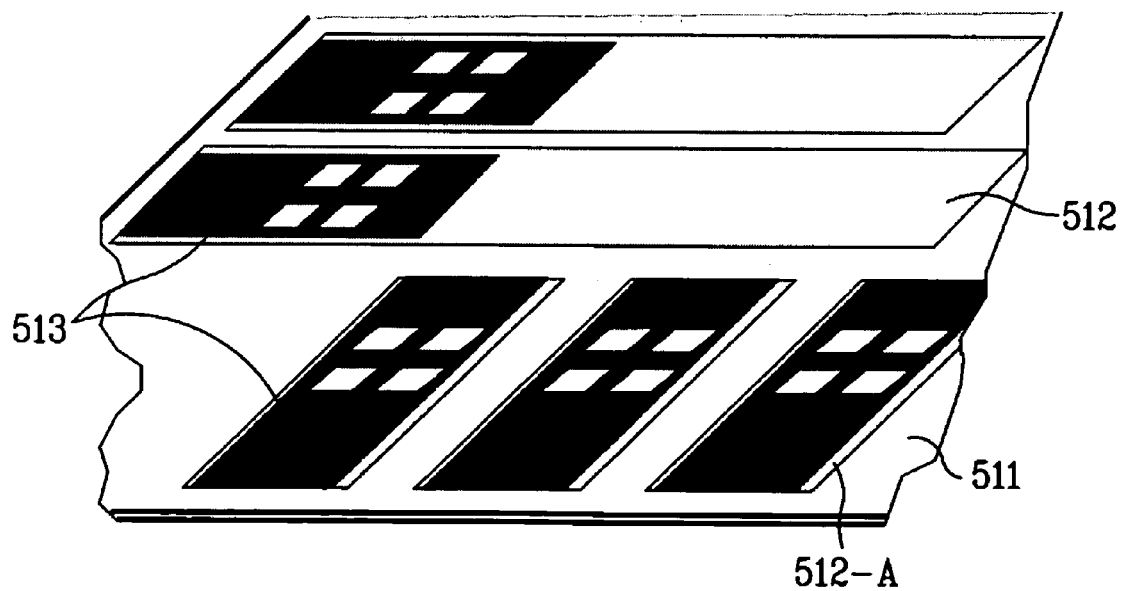

Subsequently, as shown in FIG. 5B, the counter electrode 513 is formed of a highly conductive metal, such as molybdenum (Mo) and chrome (Cr), so as to have a width smaller than that of the ITO strip 512. Herein, the counter electrode 513 at a vertical crossing point between the sealant, used in a later sealing process, and the counter electrode 513 is formed in a grid form. Therefore, when the sealant is hardened by using UW light rays, the unhardened portion of the sealant and the line-width of the counter electrode 513 are simultaneously reduced, thereby preventing the increase in the line resistance.

Figure 6:
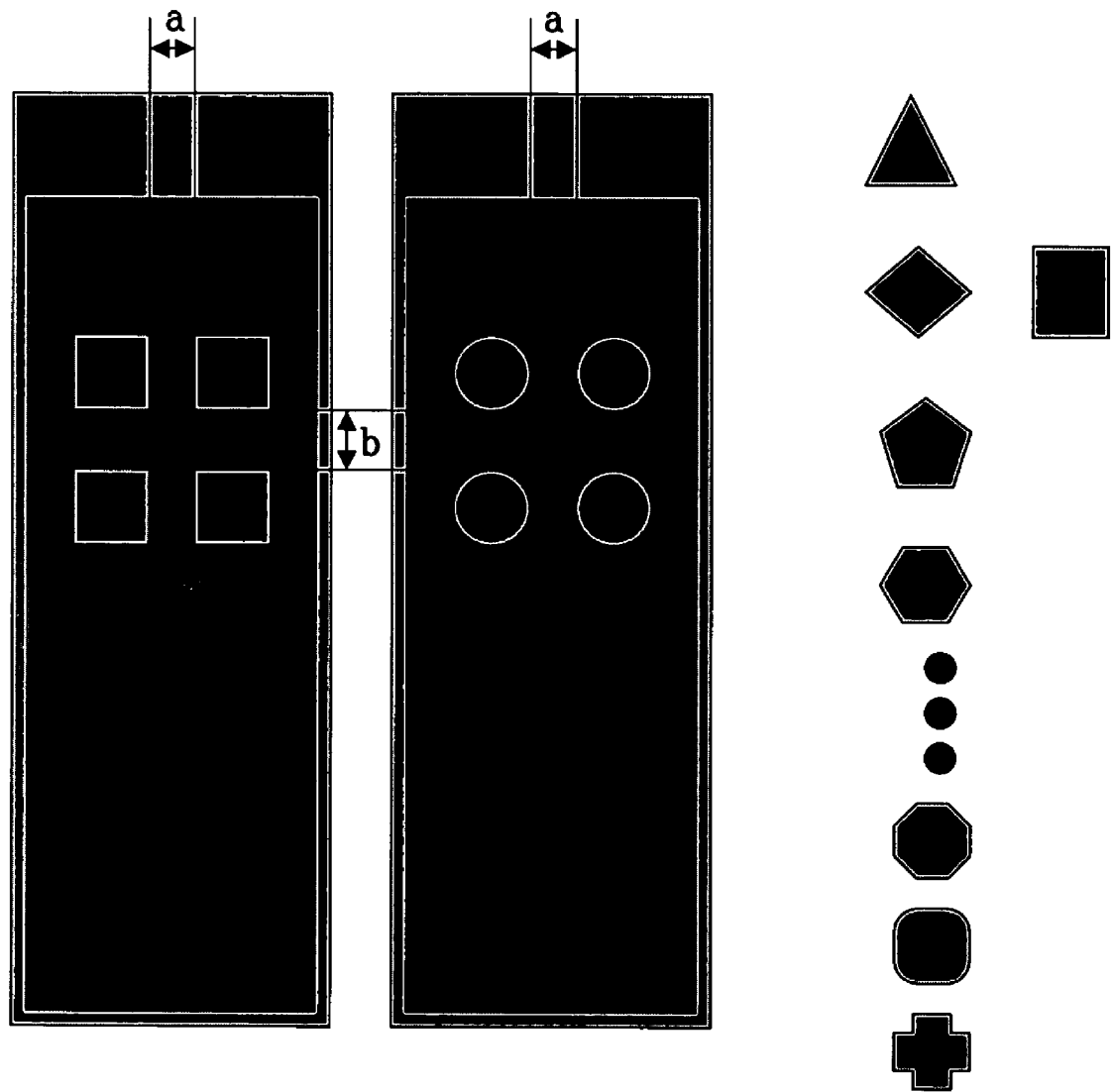
FIG. 6 illustrates a detailed view showing the structure of a counter electrode according to the present invention.

More specifically, as shown in FIG. 6, the counter electrode 513 can be formed of one of or a combination of at least two (2) of a polygon, a cross, and a circle, in the form of a grid. However, the grid patterns should be spaced apart at an optimum distance "b", so as to prevent the adjacent grid patterns from contacting one another. Preferably, the distance "a" between each shape in the grid pattern should also be greater than zero (0).

Figure 5C:
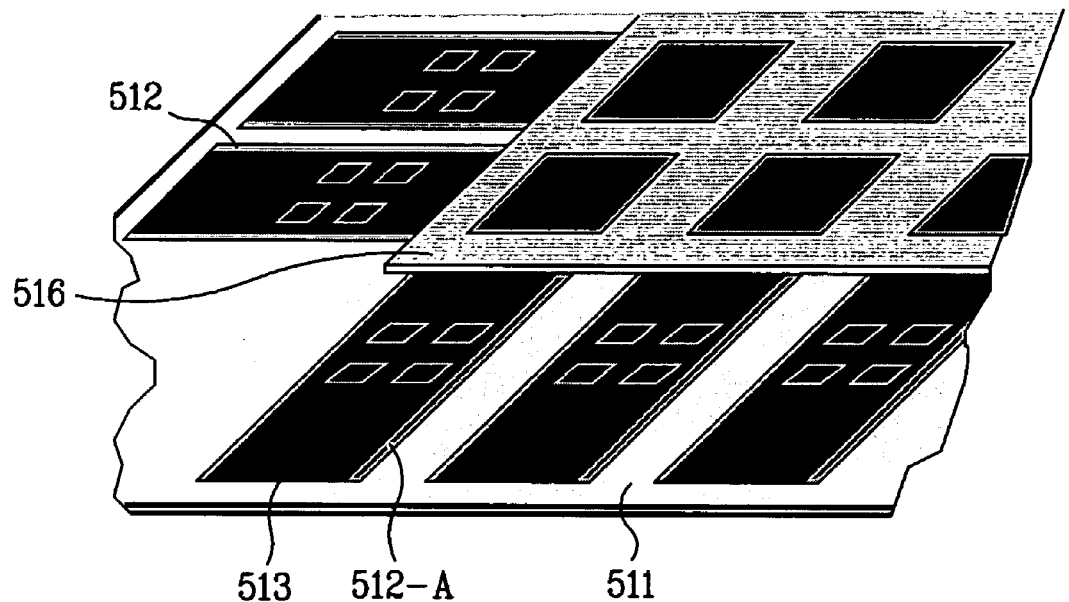
Figure 5D:
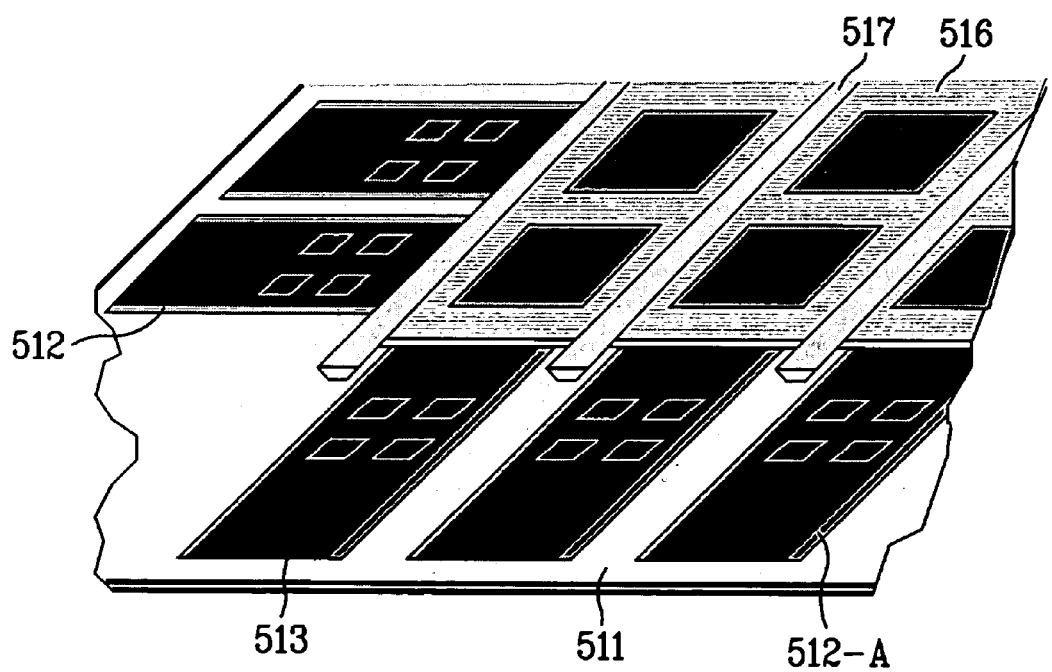

Subsequently, the insulating layer 516 is formed, as shown in FIG. 5C. Herein, insulating layer 516 does not extend into an area where the counter electrode overlaps the sealant. In accordance with an alternative embodiment shown in FIG. 5G the insulating layer 516 is extended to a predetermined region including the region whereby the counter electrode 513 overlaps (e.g., crosses) the sealant, and also to a portion of the glass substrate 511, so as to be formed at a peripheral region of the organic EL layer, which is formed in a later process. Moreover, referring to FIG. 5D, a barrier rib 517 is formed to electrically insulate the cathode strips, which are also formed in a later process.

Figure 5E:
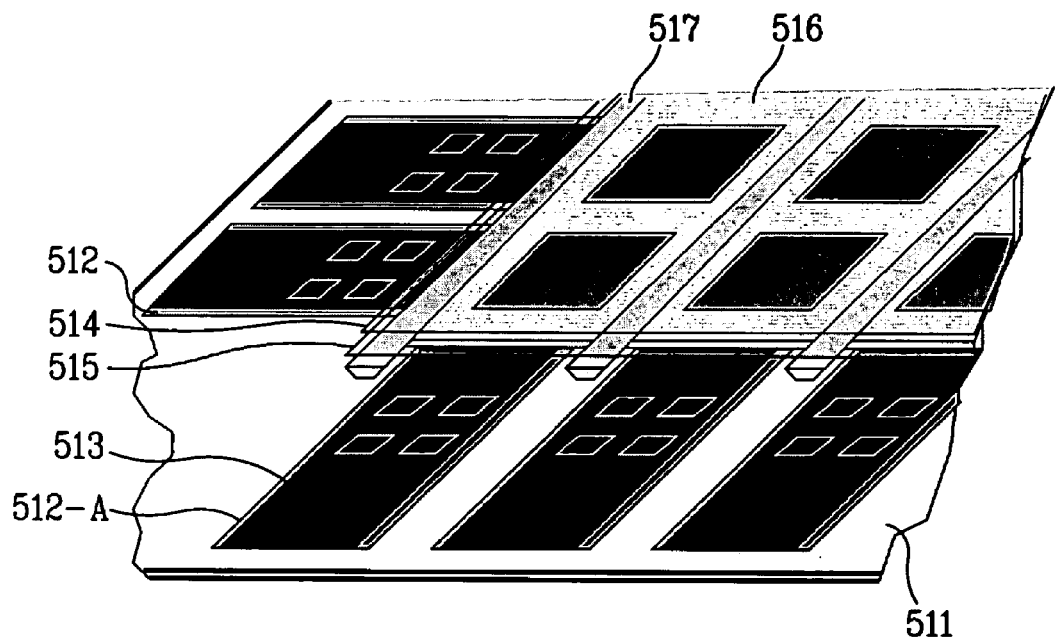
Figure 5F:
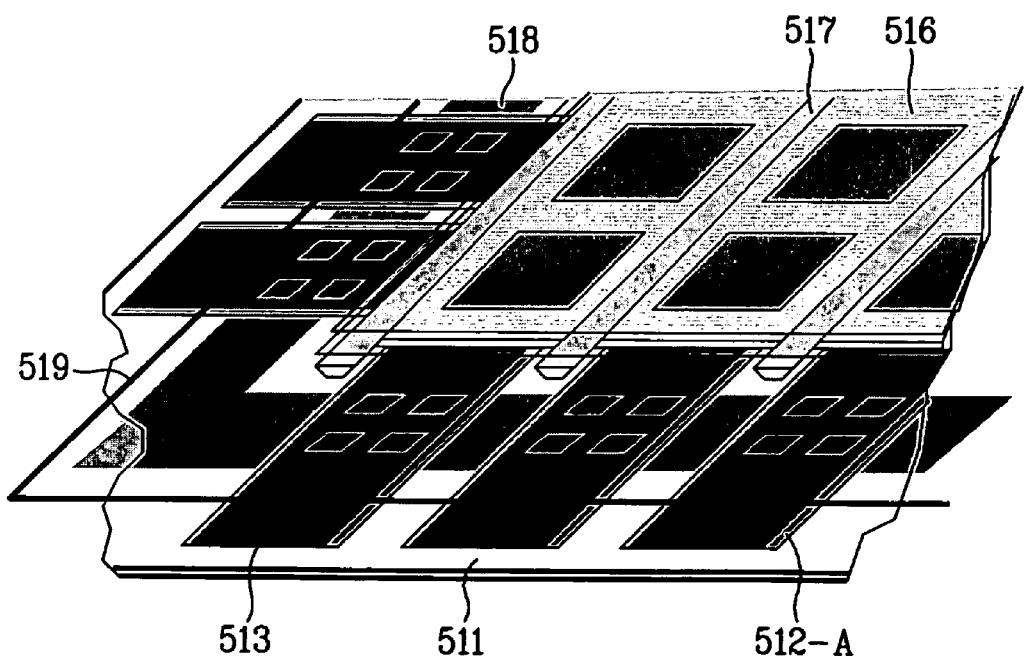
Figure 5G:
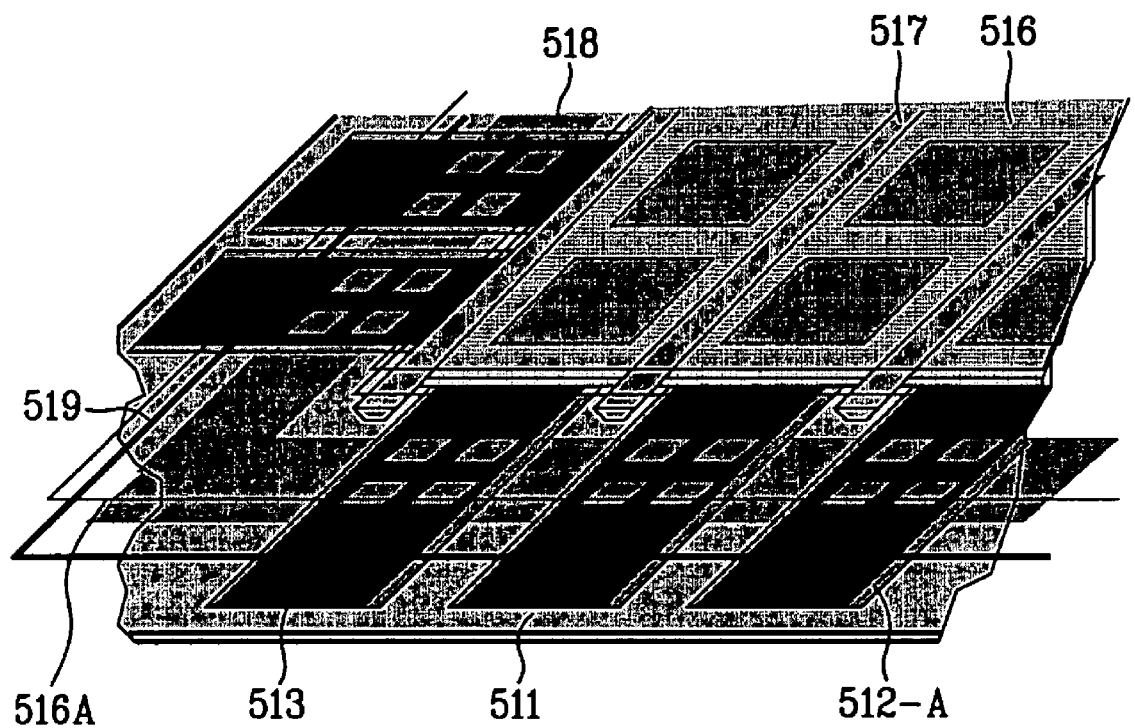
FIG. 5G shows a process step for forming an insulating layer in accordance with an alternative embodiment.

Thereafter, as shown in FIG. 5E, the organic EL layer 514 formed of a hole transport layer, an emission layer, and an electron transport layer is deposited, and then, a plurality of cathode strips 515, which is formed of a magnesium (Mg)-silver (Ag) alloy and aluminum or other a conductive materials, is formed thereon. Finally, the sealant 518 is used to adhere the seal-cover 519, as shown in FIG. 5F, thereby completing the organic EL display panel.

FIGS. 7A to 7C illustrate a comparison between the conventional counter electrode and the counter electrode according to the present invention.

Figure 1:
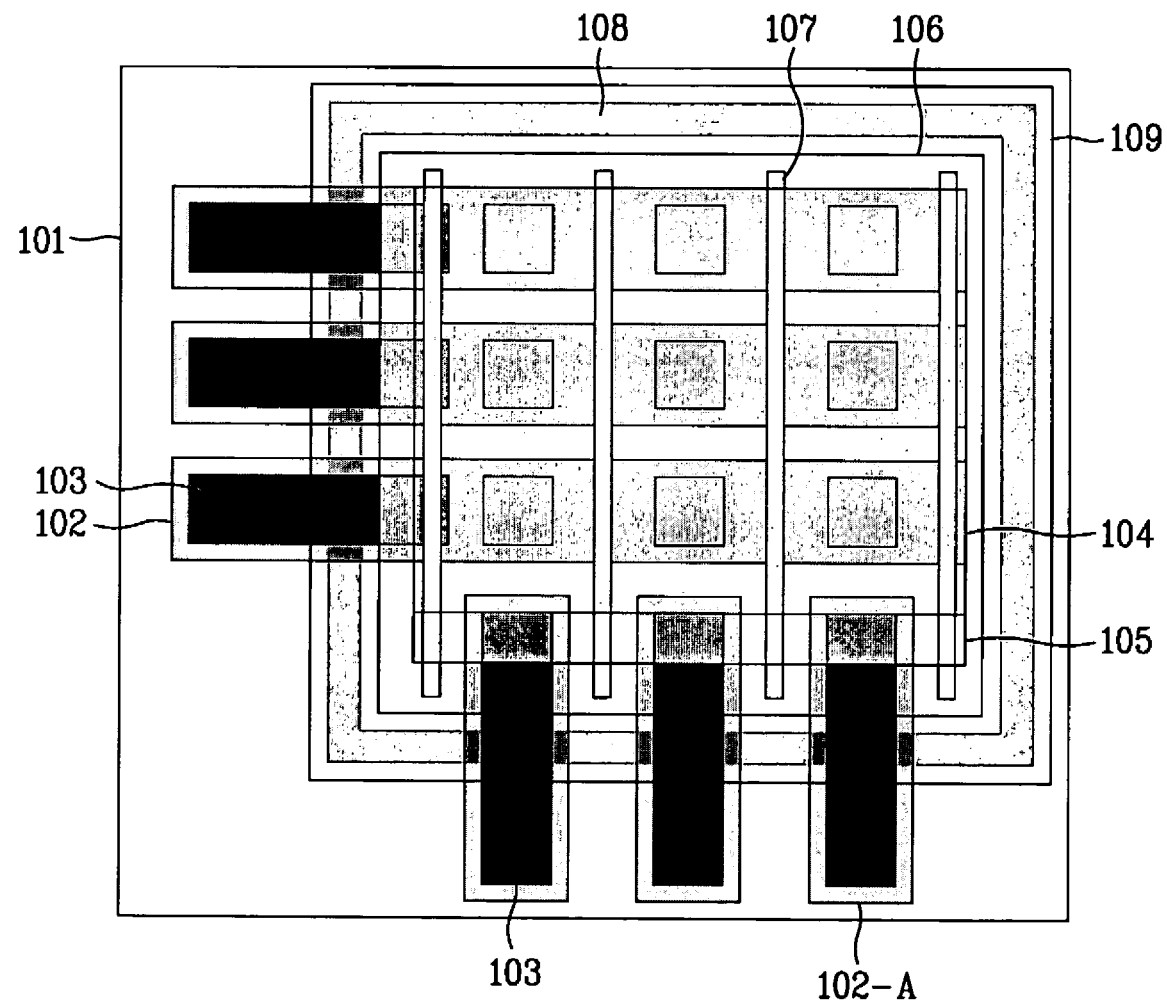
FIG. 1 illustrates a plane view of a general organic electroluminescence display panel.
Figure 2A:
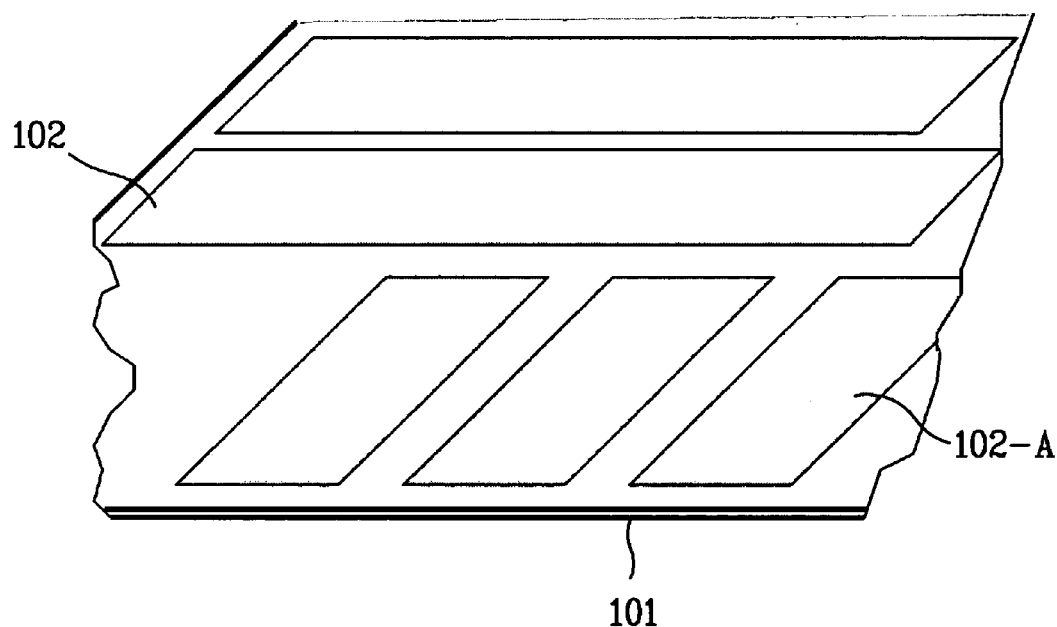
FIGS. 2A to 2F illustrate perspective views of the process steps for fabricating the general organic electroluminescence display panel.
Figure 2B:
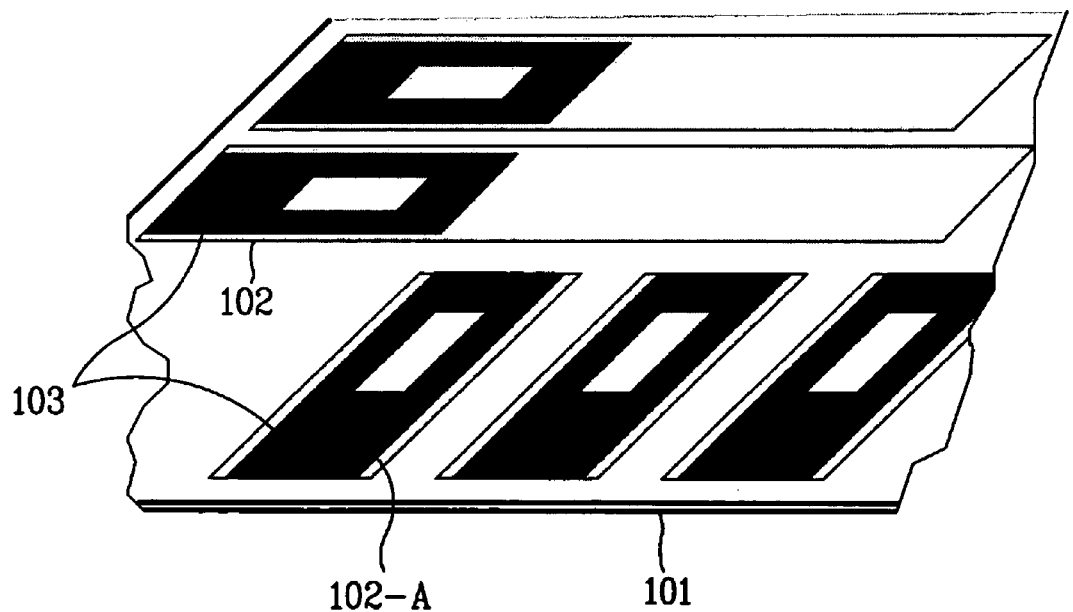
Figure 2C:
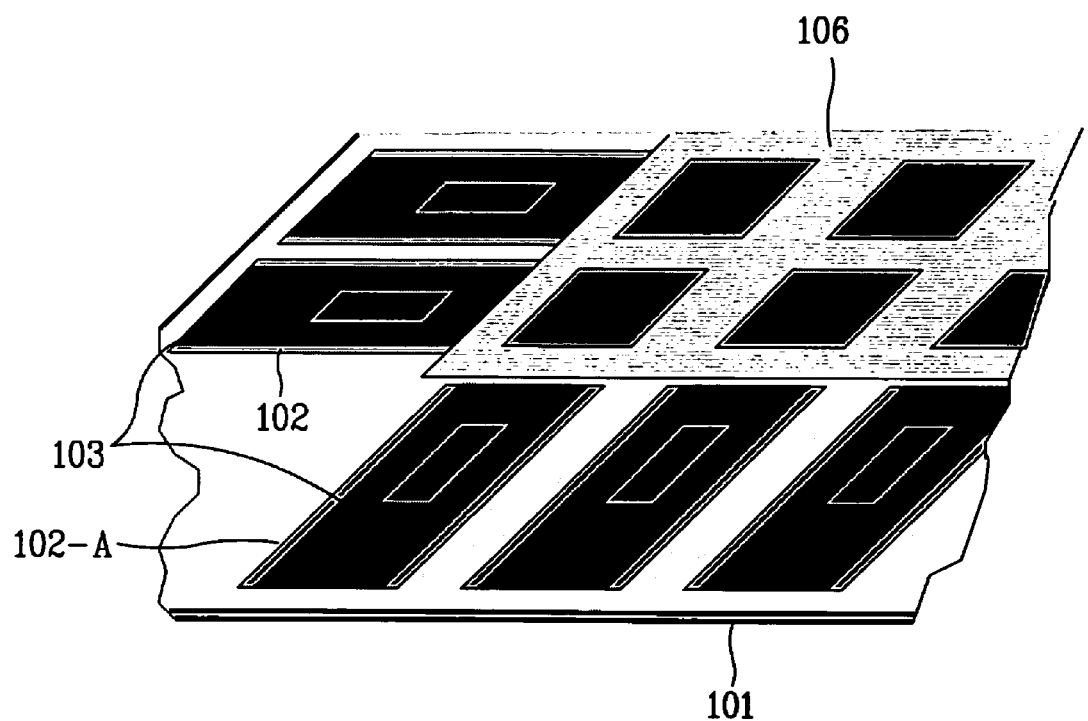
Figure 2D:
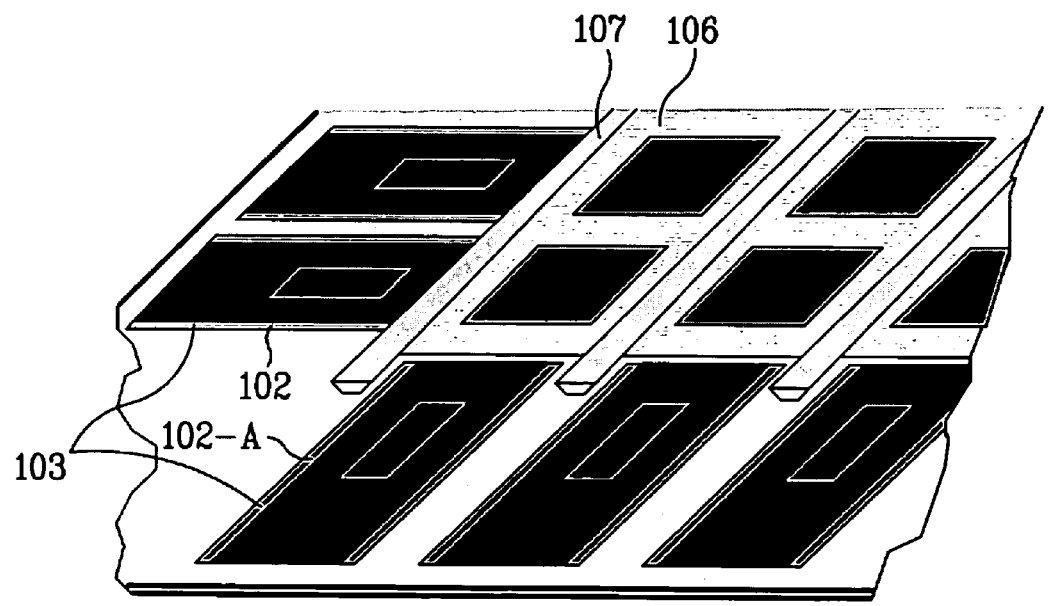
Figure 2E:
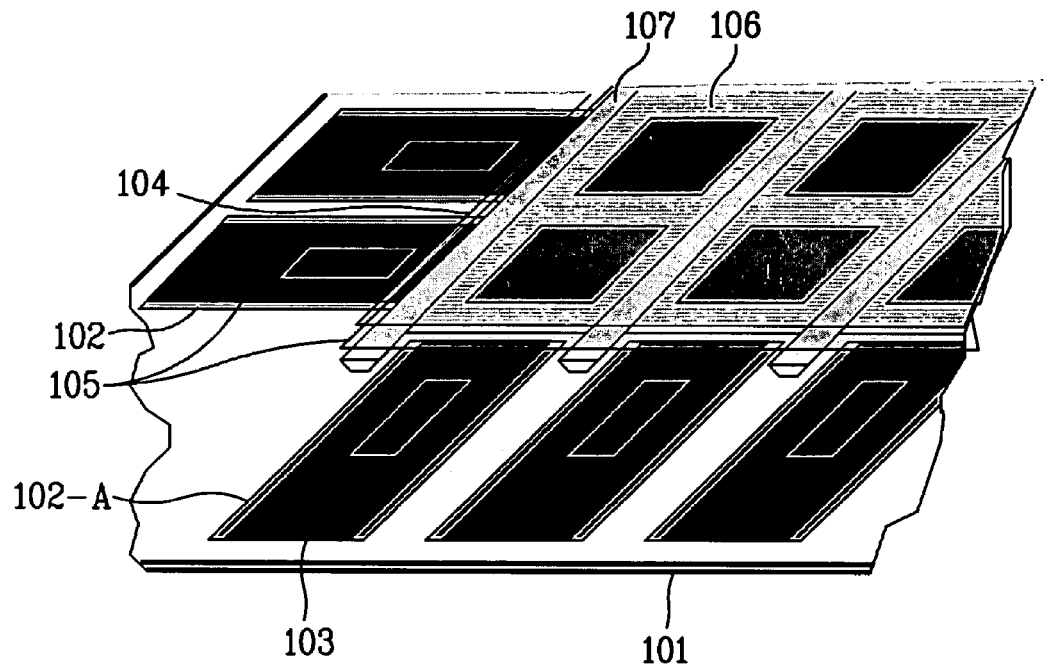
Figure 2F:
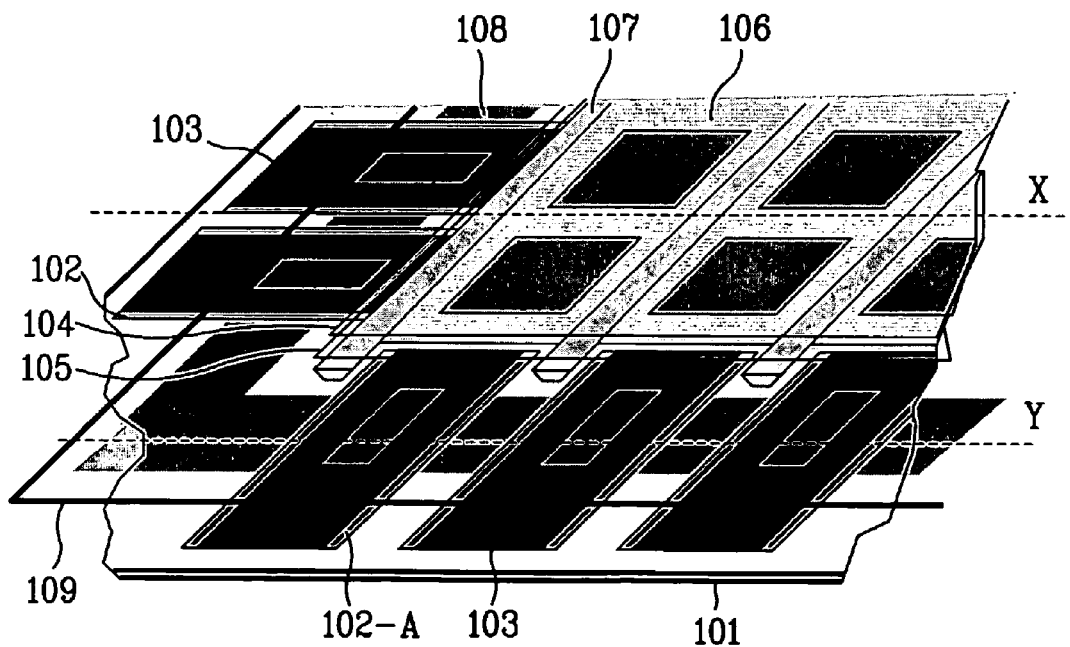
Figure 3A:
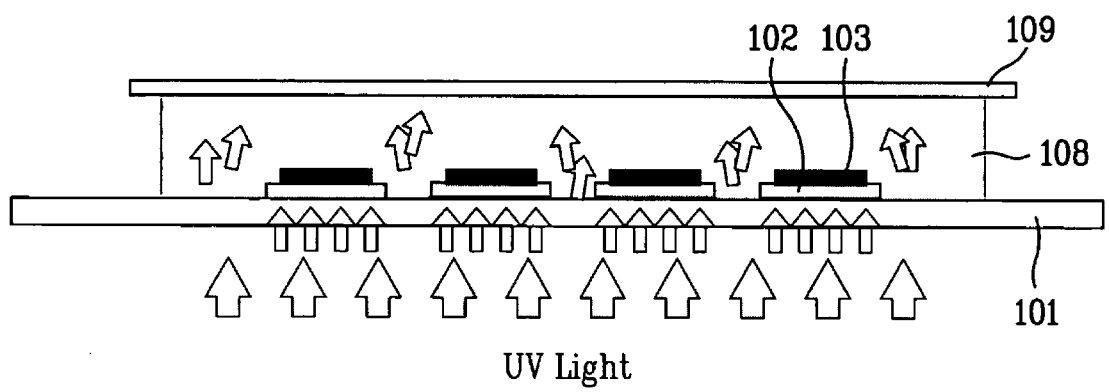
FIG. 3A illustrates a cross-sectional view of the panel taken along an X direction of FIG. 2F.
Figure 3B:
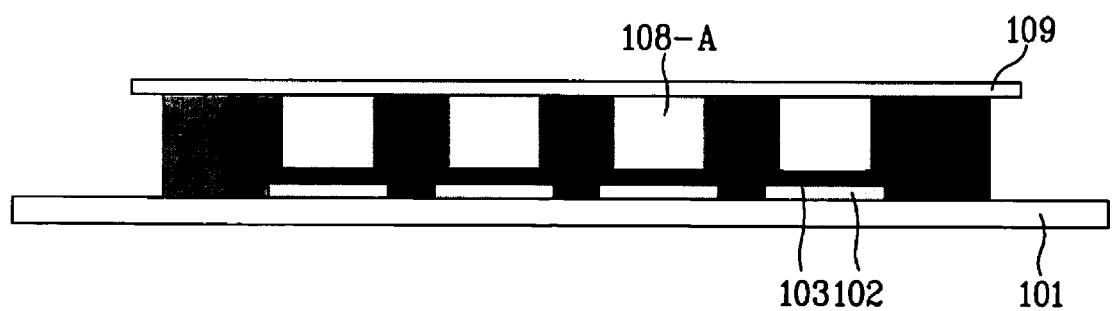
FIG. 3B illustrates a cross-sectional view of the panel taken along a Y direction of FIG. 2F.
Figure 4:
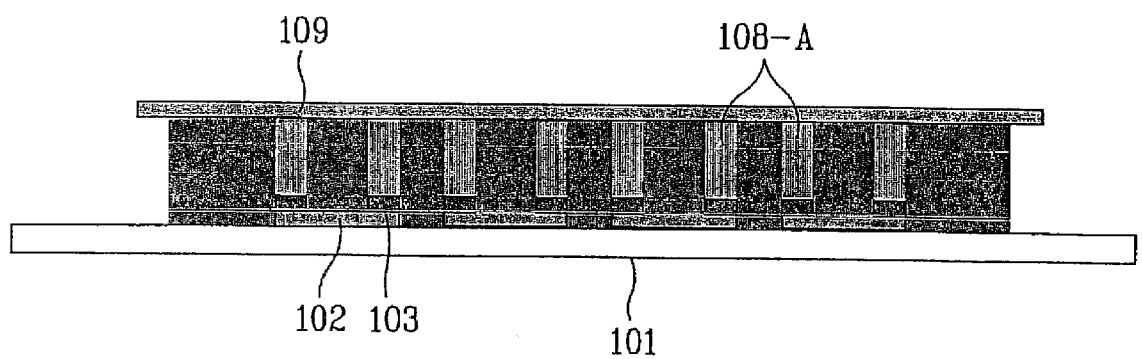
FIG. 4 illustrates a cross-sectional view of a related art organic electro-luminescence display panel taken along a Y direction.

FIG. 7A illustrates the counter electrode 103 formed by the fabrication process shown in FIGS. 2A to 2F. FIG. 7B illustrates the counter electrode formed by the fabrication process shown in FIG. 4. And, FIG. 7C illustrates the counter electrode 513 according to the present invention.

Herein, the counter electrode 513 according to the present invention is formed to have a width smaller than that of the ITO strip 512. In other words, the width of the ITO strip 102, 202, and 512, shown in FIGS. 7A to 7C, is uniform. However, the width of the respective counter electrodes 203 and 513 of FIGS. 7B and 7C is the smallest. Moreover, as shown in FIG. 7C, the counter electrode 513 is formed in a grid form, thereby reducing line resistance.

As described above, in the organic electroluminescence display panel according to the present invention, the surface of the crossing point between the sealant 518 and the counter electrode 513 is reduced, resulting in a decrease in line resistance, thereby enhancing the adhesion between the glass substrate 511 and the seal-cover 519.

Furthermore, by decreasing line resistance and enhancing adhesion between the glass substrate 511 and the seal-cover 519, the efficiency and durability of the organic electroluminescence display panel according to the present invention can also be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescence display panel, comprising:
    a glass substrate;
    an indium-tin-oxide strip;
    a counter electrode;
    an organic electroluminous layer;
    a cathode strip;
    a seal-cover over the glass substrate, wherein the organic electroluminous layer is formed between the indium-tin-oxide strip and the cathode strip, and the counter electrode has a plurality of holes aligned in first and second directions and, wherein the first direction is perpendicular to the second direction, wherein the holes in the counter electrode have a shape of a cross;
    an insulating layer between the indium-tin-oxide strip and the cathode strip; and
    a sealant to adhere the seal-cover over the glass substrate, wherein the insulating layer extends to a predetermined area, including a crossing point between the counter electrode and the sealant, and to an area of the glass substrate, so as to be formed on a periphery of the organic electroluminous layer;
    wherein the indium-tin-oxide strip includes a plurality of horizontal indium-tin-oxide strips and a plurality of vertical indium-tin-oxide strips;
    wherein the plurality of the horizontal indium-tin-oxide strips are longer than the plurality of the vertical indium-tin-oxide strips;
    wherein the counter electrode includes a plurality of horizontal counter electrodes and a plurality of vertical counter electrodes;
    wherein each of the horizontal counter electrodes is formed on each of the horizontal indium-tin-oxide strips;
    wherein each of the vertical counter electrodes is formed on each of the vertical indium-tin-oxide strips;
    wherein the each vertical counter electrodes is positioned closer to a one side of the each vertical indium-tin-oxide strip more than other side of each vertical indium-tin-oxide strip;
    wherein the one side of one of the vertical indium-tin-oxide strips faces directly toward the other side of other one of the vertical indium-tin-oxide strips;
    wherein the one of the vertical indium-tin-oxide strips is adjacent to the other one of the vertical indium-tin-oxide strips.

2. The organic electroluminescence display panel according to claim 1, wherein the counter electrode is formed of a metal including at least one of molybdenum (Mo) or chrome (Cr).

3. The organic electroluminescence display panel according to claim 2, wherein the cathode strip is formed of a conductive material including at least one of a magnesium (Mg)-silver (Ag) alloy or aluminum (Al).

4. The organic electroluminescence display panel according to claim 1, wherein the indium-tin-oxide strip and the cathode strip overlaps to form one or more pixel areas, and wherein the counter electrode includes multiple holes in each pixel area.

5. The organic electroluminescence display panel according to claim 1, wherein portions of the counter electrode are located between adjacent pairs of the first holes aligned in the first direction, and portions of the counter electrode are located between adjacent pairs of the second holes aligned in the second direction.

6. A method for fabricating an organic electroluminescence display panel, comprising:
  forming an indium-tin-oxide strip on a glass substrate;
  forming a counter strip on the indium-tin-oxide strip located in regions other than an emitting region;
  patterning the counter strip to have a plurality of holes;
  forming an insulating layer on the glass substrate having the indium-tin-oxide strip;
  forming a barrier rib on the insulating layer;
  forming an electroluminous (EL) layer and a cathode strip in the emitting region; and
  adhering a seal-cover to the glass substrate using a sealant, wherein the plurality of holes in the counter strip are aligned in first and second directions, wherein the first direction is perpendicular to the second direction, wherein the holes in the counter strip have a shape of a cross;
  wherein the insulating layer is formed between the indium-tin-oxide strip and the cathode strip, and
  wherein the insulating layer extends to a predetermined area, including a crossing point between the counter strip and the sealant, and to an area of the glass substrate, so as to be formed on a periphery of the electroluminous layer;
  wherein the indium-tin-oxide strip includes a plurality of horizontal indium-tin-oxide strips and a plurality of vertical indium-tin-oxide strips;
  wherein the plurality of the horizontal indium-tin-oxide strips are longer than the plurality of the vertical indium-tin-oxide strips;
  wherein the counter electrode includes a plurality of horizontal counter electrodes and a plurality of vertical counter electrodes;
  wherein each of the horizontal counter electrodes is formed on each of the horizontal indium-tin-oxide strips;
  wherein each of the vertical counter electrodes is formed on each of the vertical indium-tin-oxide strips;
  wherein the each vertical counter electrodes is positioned closer to a one side of the each vertical indium-tin-oxide strip more than other side of each vertical indium-tin-oxide strip;
  wherein the one side of one of the vertical indium-tin-oxide strips faces directly toward the other side of other one of the vertical indium-tin-oxide strips;
  wherein the one of the vertical indium-tin-oxide strips is adjacent to the other one of the vertical indium-tin-oxide strips.

7. The method according to claim 6, wherein the counter strip has a width smaller than that of the indium-tin-oxide strip.

8. The method according to claim 6, wherein the indium-tin-oxide strip and the cathode strip overlaps to form one or more pixel areas, and wherein the counter electrode includes multiple holes in each pixel area.

9. The method according to claim 8, wherein the counter electrode includes multiple first and second holes aligned in the first direction and second direction in each pixel area.

10. A method for fabricating an organic electroluminescence display panel, comprising;
  forming a first electrode layer on a substrate;
  forming a counter electrode over the first electrode layer;
  forming an insulating layer on the substrate having the first electrode layer;
  forming an electroluminous layer over the counter electrode;
  forming a second electrode layer over the electroluminous layer, wherein the counter electrode has a plurality of holes aligned in first and second directions, wherein the first direction is perpendicular to the second direction, wherein the holes in the counter electrode have a shape of a cross; and
  adhering a seal-cover to the substrate using a sealant,
  wherein the insulating layer is formed between the first electrode layer and the second electrode layer, and
  wherein the insulating layer extends to a predetermined area, including a crossing point between the counter electrode and the sealant, and to an area of the substrate, so as to be formed on a periphery of the electroluminous layer;
  wherein the first electrode includes a plurality of horizontal first electrodes and a plurality of vertical first electrodes;
  wherein the plurality of the horizontal first electrodes are longer than the plurality of the vertical first electrodes;
  wherein the counter electrode includes a plurality of horizontal counter electrodes and a plurality of vertical counter electrodes;
  wherein each of the horizontal counter electrodes is formed on each of the horizontal first electrodes;
  wherein each of the vertical counter electrodes is formed on each of the vertical first electrodes;
  wherein the each vertical counter electrodes is positioned closer to a one side of the each vertical first electrode more than other side of the each vertical first electrode;
  wherein the one side of one of the vertical first electrodes faces directly toward the other side of other one of the vertical first electrodes;
  wherein the one of the vertical first electrodes is adjacent to the other one of the vertical first electrodes.

11. The method of claim 10, wherein the holes in the counter electrode have a shape which is a combination of a polygon, a cross, or a circle.

12. The method of claim 10, wherein the first electrode layer and second electrode layer overlaps to form one or more pixel areas, and wherein the counter electrode includes multiple holes in each pixel area.

13. The organic electroluminescence display panel of claim 10, wherein the counter electrode includes multiple first holes aligned in the first direction and multiple second holes aligned in the second direction in each pixel area.

* * * * *